(12) United States Patent
Yau

(10) Patent No.: US 6,995,596 B2
(45) Date of Patent: Feb. 7, 2006

(54) PROCESS AND SKEW TOLERANT PRECHARGE CIRCUIT

(75) Inventor: Tao-Ying Yau, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/685,657

(22) Filed: Oct. 14, 2003

(65) Prior Publication Data

US 2005/0077940 A1 Apr. 14, 2005

(51) Int. Cl.
*H03H 11/26* (2006.01)
(52) U.S. Cl. ...................... 327/263; 365/203
(58) Field of Classification Search ............... 327/261, 327/263, 264; 365/203, 204, 189.01, 233
See application file for complete search history.

(56) References Cited

U.S. PATENT DOCUMENTS

| 5,673,225 | A | * | 9/1997 | Jeong et al. ............ 365/189.11 |
| 5,777,935 | A | * | 7/1998 | Pantelakis et al. .......... 365/203 |
| 6,198,679 | B1 | * | 3/2001 | Nakasu et al. .............. 365/203 |
| 6,205,069 | B1 | * | 3/2001 | Kim ........................... 365/203 |
| 6,288,959 | B1 | * | 9/2001 | OuYang et al. ............. 365/203 |

* cited by examiner

*Primary Examiner*—Minh Nguyen
(74) *Attorney, Agent, or Firm*—Martine Penilla & Gencarella LLP

(57) ABSTRACT

The precharge circuit includes circuitry for initiating charging of a precharge pulse at a first edge of a first clock-like signal. The precharge circuit also includes circuitry for ending the charging of the precharge pulse after a time period that is longer of a preset delay period and a time period designated by a second edge of the second clock-like signal.

23 Claims, 8 Drawing Sheets

Fig. 1 *(Prior Art)*

PROCESS AND SKEW TOLERANT PRECHARGE CIRCUIT

BACKGROUND OF THE INVENTION

1. Field of the Invention

The present invention relates generally to electrical circuits, and more particularly, to methods and apparatus for enabling an optimum amount of precharging time in a precharging operation.

2. Description of the Related Art

In memory circuits, current designs of precharge circuits can exhibit performance limitations when clocking signals are increased to a high level. As the clock frequency becomes faster and faster, the integrity of the precharge pulse shape/width becomes harder to maintain. Eventually, at high clock speeds, the precharge pulse width becomes too small to fully precharge the memory cells.

FIG. 1 shows a precharge circuit 100 with an array of memory cells organized in rows and columns. The first row 102 contains memory cells, such as, for example, cell 104, cell 106, and cell 108. The array contains a series of rows, such as second row 110 and so on. Memory cell 104 is connected to a bitline 112, indicated by a dash mark where memory cell 104 and bitline 112 intersect. As is well known, bitlines, such as bitline 112 allows the reading of the data stored in memory cell 104. Write bitlines, which may or may not be the same as bitline 112, would allow the writing of data to the memory cell 104. The memory cells located in the column formed below memory cell 104 are also connected to bitline 112. Bitline 112 is connected to sense amp 116 and precharge device 114 is attached to bitline 112. The precharge device 114 precharges the associated bitline 112.

As the clocking frequency of the system increases, problems can occur due to skew when the clock speed becomes higher as is typically desired. Therefore, problems may occur where there may not be enough time to properly precharge the bitlines due to the higher clock speeds. For example, if the clocking speed becomes very high, the bitlines may not be able to achieve the designed precharge voltage level.

In view of the foregoing, there is a need for memory designs and circuits for balancing precharge delivered to bitlines that couple to memory cells in banked architectures.

SUMMARY OF THE INVENTION

Broadly speaking, the present invention fills these needs by providing a precharge circuit that is process and skew tolerant. It should be appreciated that the present invention can be implemented in numerous ways, including as a process, an apparatus, a system, or a device. Several inventive embodiments of the present invention are described below.

In one embodiment, a method of generating a precharge pulse is provided. The method includes initiating charging of a precharge pulse at a first edge of a first clock-like signal. The method further includes ending the charging of the precharge pulse after a time period that is longer of a preset delay period and a time period designated by a second edge of the second clock-like signal.

In another embodiment, a precharge circuit capable of generating a precharge pulse is provided. The precharge circuit includes circuitry for initiating charging of a precharge pulse at a first edge of a first clock-like signal. The precharge circuit also includes circuitry for ending the charging of the precharge pulse after a time period that is longer of a preset delay period and a time period designated by a second edge of the second clock-like signal.

In yet another embodiment, a method of generating a precharge pulse is provided. The method includes initiating charging of a precharge pulse at a first edge of a first clock-like signal. The method further includes ending the charging of the precharge pulse after a time period that is longer of a preset delay period and a time period designated by a second edge of the second clock-like signal, the preset delay period being determined by a self-timed pulse. The precharge pulse initiates the precharging of bitlines and the precharging edge when the precharge pulse ends.

The advantages of the present invention are numerous. Most notably by using the advantage of a clock generated pulse and the advantage of a self-timed pulse, an optimum amount of time for precharging may be utilized. Therefore, even when the clock frequency becomes high, sufficient time is allowed for the precharging circuit to generate the precharge. Therefore, if the clock skew or jitter gets worse than expected, the precharge pulse shape/width is determined by the self-timed pulse, and if the self-timed pulse is too short, then the precharge pulse shape/width is determined by the rising edge of a clock cycle. The precharge is initiated by the falling edge of the clock which also generates a self-timed pulse. If the clock skew or jitter gets worse than expected, the precharge pulse shape/width is determined by the self-timed pulse, and if the self-timed pulse is too short, then the precharge pulse shape/width is determined by the rising edge of the clock. Consequently, just the right amount of time is utilized to generate the desired precharge pulse. As a result, memory cells are more efficient and reliable thereby decreasing the chances of memory error and loss of data.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION OF THE PREFERRED EMBODIMENTS

An invention is disclosed for a precharge circuit that is process and skew tolerant. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Generally speaking, the invention deals with the methods for precharging the bitlines in a memory array and the associated circuit architecture. In one exemplary embodiment, there will be 2 bitline segments for each column. Therefore, the number of precharge devices will be equal to the amount of bitline segments in this embodiment.

As is well known, when precharging is discontinued, if bitline and bitline# are not at a logic HIGH "1", and it is attempted to read a memory cell, the memory cell's content may be overwritten. Therefore, the bitline is typically charged to a particular voltage level if the logic HIGH "1" is to be maintained. Consequently, by adjusting the precharge pulse to be a certain minimum width, the precharging time is long enough for fully precharging the bitlines. Thus, memory integrity is maintained even when clock speeds become increasingly fast.

In one embodiment, the methodology and the apparatus described herein creates a precharge signal that combines the advantage of a clock generated pulse, i.e., slowing the clock frequency can restore the precharge pulse shape/width with that of a self-timed circuit, i.e., pulse shape/width that is independent of the clock jitter and skew.

The precharge is initiated by the falling edge of the clock which also generates a self-timed pulse. The precharge pulse shape/width is determined by the later of either the rising edge of the clock or the end of the self-timed pulse. If the clock skew or jitter gets worse than expected, the precharge pulse shape/width is determined by the self-timed pulse, and if the self-timed pulse is too short, then the precharge pulse shape/width is determined by the rising edge of the clock. Therefore, regardless of the conditions of the clock signal, the precharge pulse will be an optimal width. The precharge pulse is fed into circuitry which precharges the attached bitlines. When the precharge pulse ends, the precharging of the attached bitlines is stopped. Therefore, by intelligently and powerfully managing the width of the precharge pulse, the precharging time may be controlled and accomplished.

Figure 1:
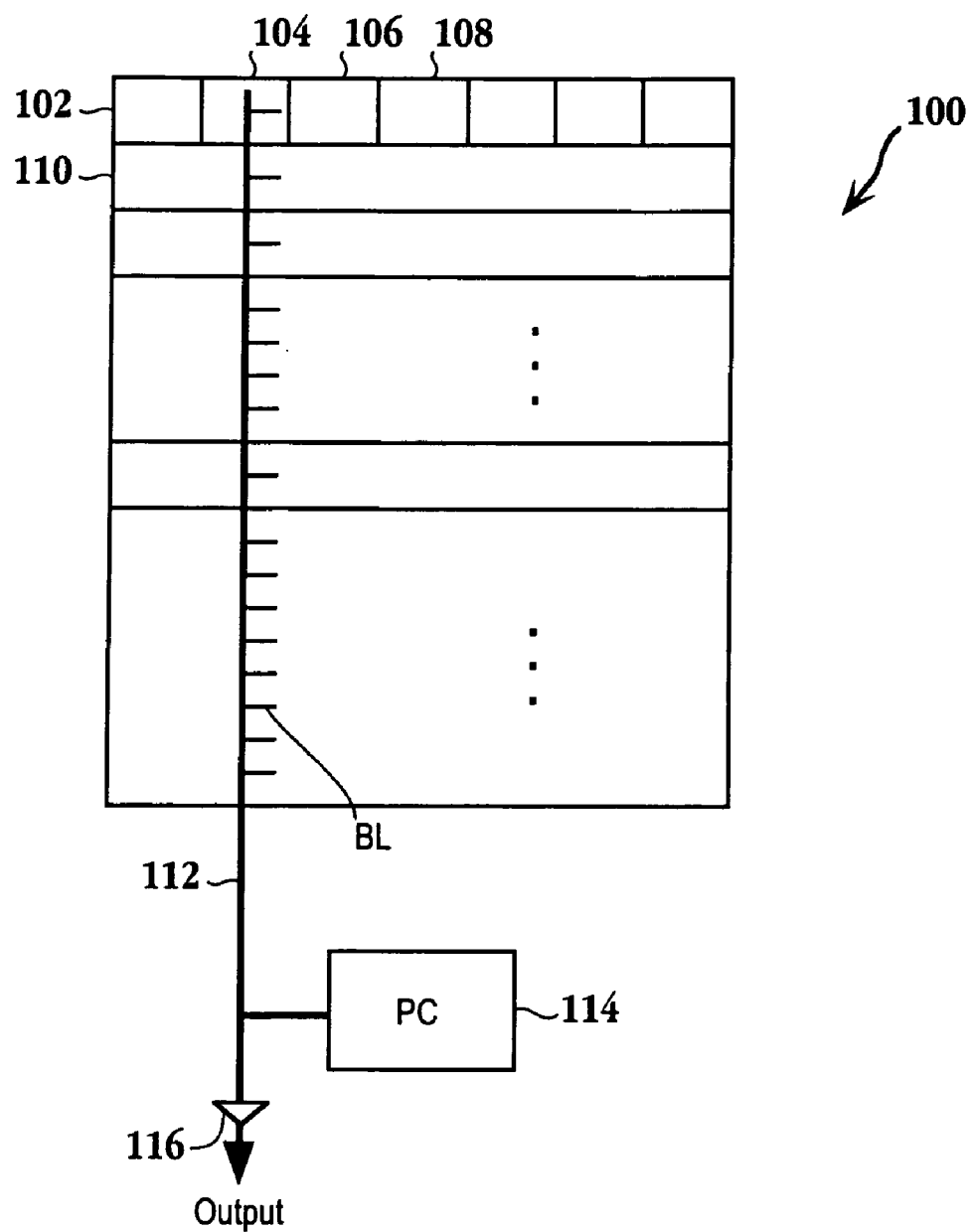
FIG. 1 shows a precharge circuit with an array of memory cells organized in rows and columns.
Figure 2:
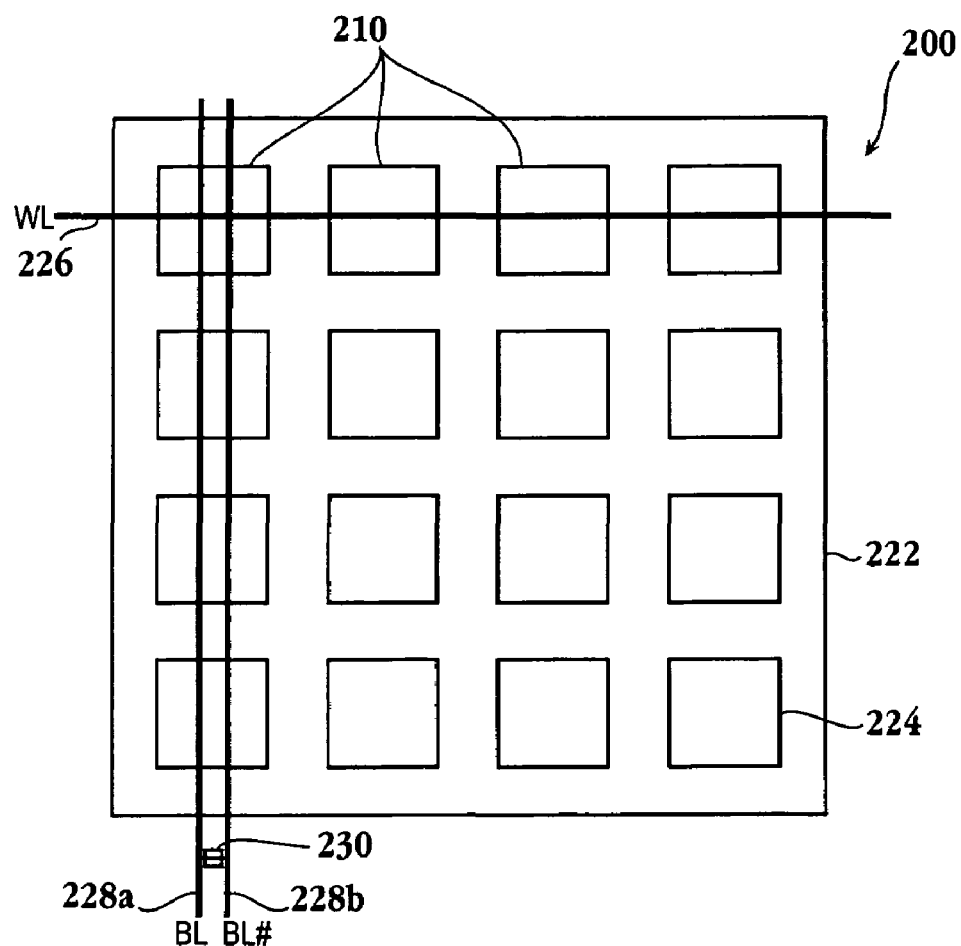
FIG. 2 illustrates a block diagram of memory cells that is connected to a precharge circuit in accordance with one embodiment of the present invention.

FIG. 2 illustrates a block diagram 200 of memory cells 210 that is connected to a precharge circuit 230 in accordance with one embodiment of the present invention. In one embodiment, the a wordline 226 connects the memory cells 210 in a memory device 222. The memory device 222 may also include a bitline 228a and a bitline bar 228b. The memory device may be any suitable apparatus that can store data such as, for example, SRAM, register files, etc. In one embodiment, the precharge circuit 230 may precharge the bitlines 228a and 228b. The precharge circuit 230 may perform the precharging so the precharge pulse shape/width generated by the precharge circuit 230 is determined by the later of the rising edge of the clock and the end of the self-timed pulse. Therefore, the precharge pulse has a shape and/or width that is at least a certain minimum as determined by a particular application. By having a minimum precharge pulse shape/width, a certain minimum precharging time is enabled. Therefore, by having a certain minimum precharging time, the bitlines 228a and 228b may be fully precharged to the designed voltage.

Figure 3:
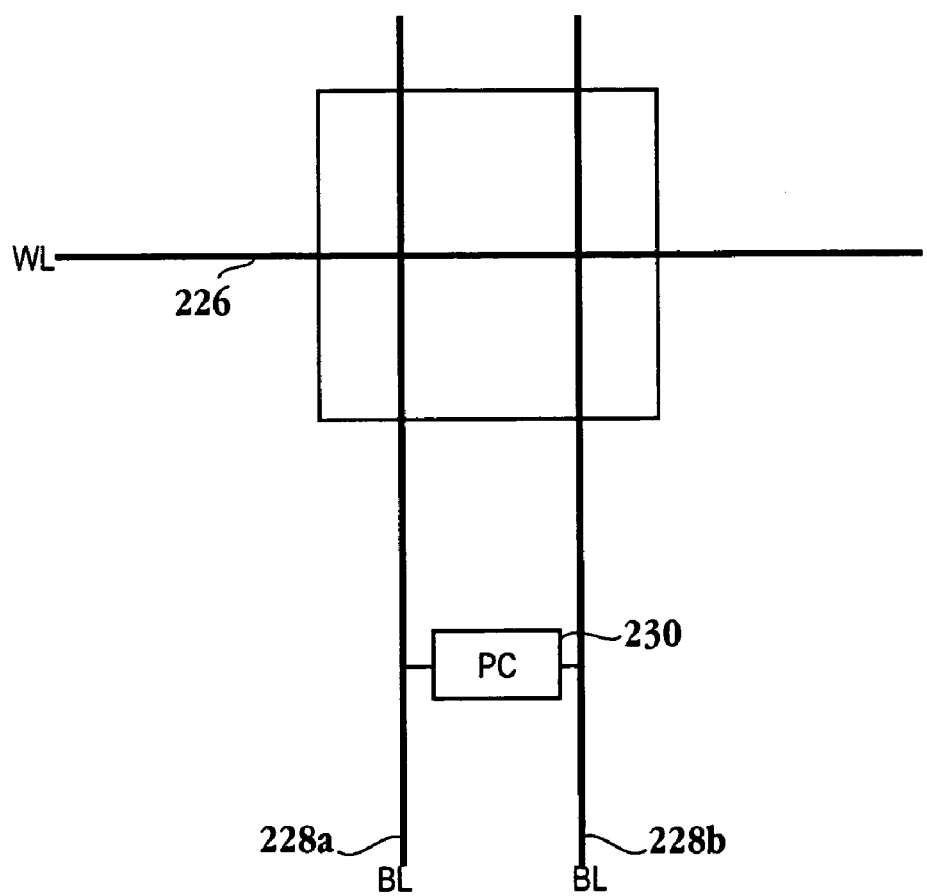
FIG. 3 illustrates a location of the precharge circuit in accordance with one embodiment of the present invention.

FIG. 3 illustrates a location of the precharge circuit 230 in accordance with one embodiment of the present invention. In one embodiment, the precharge circuit 230 is located between bitlines 228a and 228b. Therefore, the precharge circuit 230 may manage the precharge on the bitlines 228a and 228b. As discussed in reference to FIGS. 7 and 8 below, the precharge circuit 230 generates a precharge pulse which electrically configures circuitry to enable the accessing of voltage to generate the charging of the bitlines 228a and 228b with a precharge. It should be appreciated that the precharge circuit 230 may be located in any suitable location as long as the methodology for generating a precharge pulse is enabled. The precharge pulse electrically configures the precharge circuit 230 so voltage may be applied to the bitlines 228a and 228b thus generating a precharge.

Figure 4:
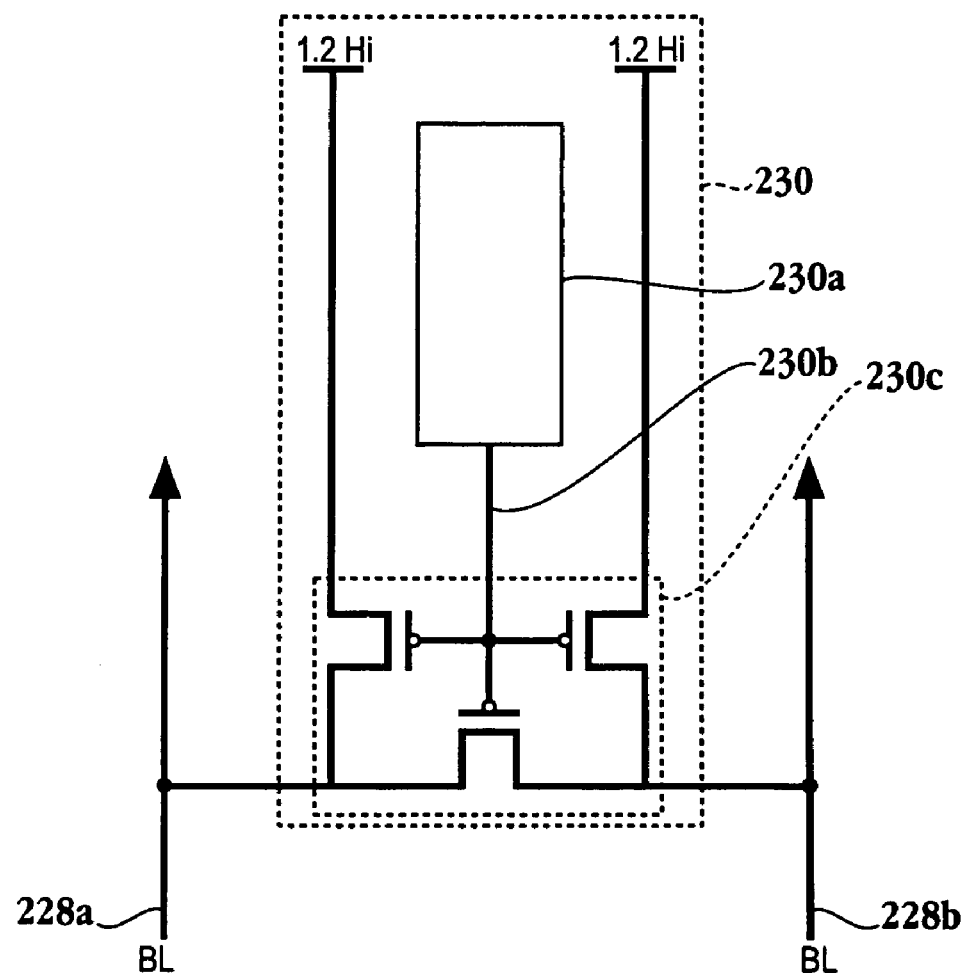
FIG. 4 shows a close-up of the precharge circuit in accordance with one embodiment of the present invention.

FIG. 4 shows a close-up of the precharge circuit 230 in accordance with one embodiment of the present invention. In one embodiment, the precharge circuit 230 includes a precharge management circuit 230a that manages the precharge applied to the bitlines 228a and 228b. The precharge circuit 230 also includes a voltage sources that may be allowed to precharge the bitlines 228a and 228b depending on the electrical configuration of the precharge management circuit 230a.

The precharge circuit 230 may include circuitry for initiating charging of a precharge pulse at a first edge of a first clock-like signal and circuitry for ending the charging of the precharge pulse after a time period that is longer of a preset delay period and a time period designated by a second edge of the second clock-like signal. In one embodiment, the precharge management circuit 230a includes circuitry that is configured to perform the precharging so the precharge pulse shape/width is at least as long/wide as determined by the later of the rising edge of the clock and the end of the self-timed pulse.

The precharge pulse electrically configures circuit 230c to precharge the bitlines 228a and 228b. Consequently, in one embodiment, the bitlines 228a and 228b are charged during the precharge pulse and the charging terminates when the precharge pulse stops. Therefore, by making sure that the precharge pulse is of a certain time period, the bitlines 228a and 228b may be charged properly. In addition, by using dual clock like signals, one of the clock-like signals can generate a self-timed pulse and the other of the clock-like signals can extend the precharge pulse beyond the end of the self-timed pulse as described in further detail in reference to FIGS. 7 and 8.

Figure 5:
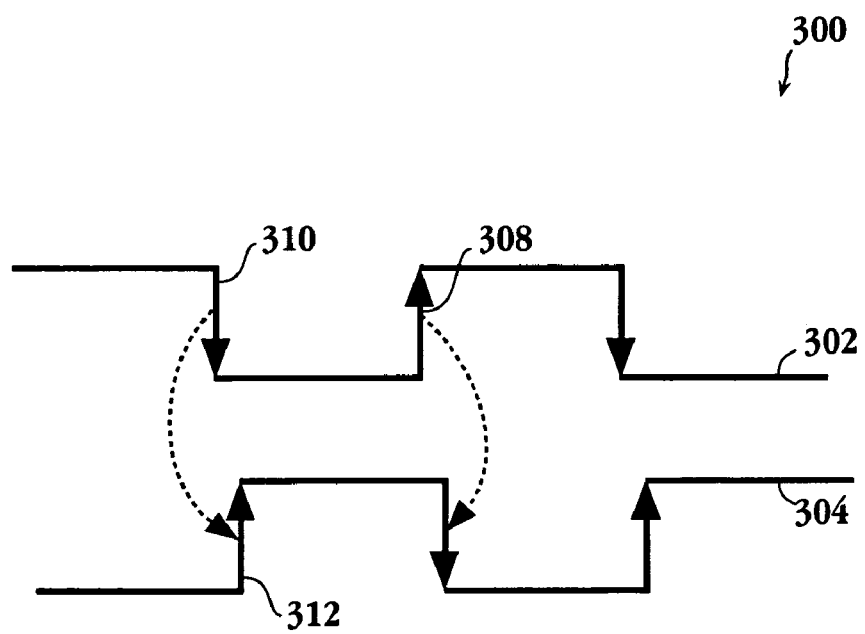
FIG. 5 shows a timing diagram showing timing of a generation of a precharge pulse.

FIG. 5 shows a timing diagram 300 showing timing of a generation of a precharge pulse. In one embodiment, a clock signal 302 has a rising edge 308 and a falling edge 310. It should be appreciated that any suitable type of clocking or clock-like signal may be utilized as known to those skilled in the art to utilize the methodology described herein. In one embodiment, the falling edge 310 initiates the starting of the generation of the precharge pulse 304 as shown in timing diagram 304. It should be appreciated that in another embodiment, the rising edge 308 may initiate the generating of the precharge pulse 304. The timing diagram 304 shows the beginning of the precharge pulse generation as shown by rising edge 312.

In one embodiment, when the falling edge 310 initiates the precharge pulse, the rising edge 308 can terminate the charging process. It should be appreciated that when the rising edge 308 initiates the generation of the precharge pulse, the falling edge 310 may terminate the precharging process. Whether the falling edge 310 or the rising edge 308 initiates or ends the precharge pulse may be determined depending on the configuration of the circuitry utilized to generated the precharge pulse. This process can be utilized with the self-timed pulse described in reference to FIG. 6 to generate the methodology described in FIG. 7.

Figure 6:
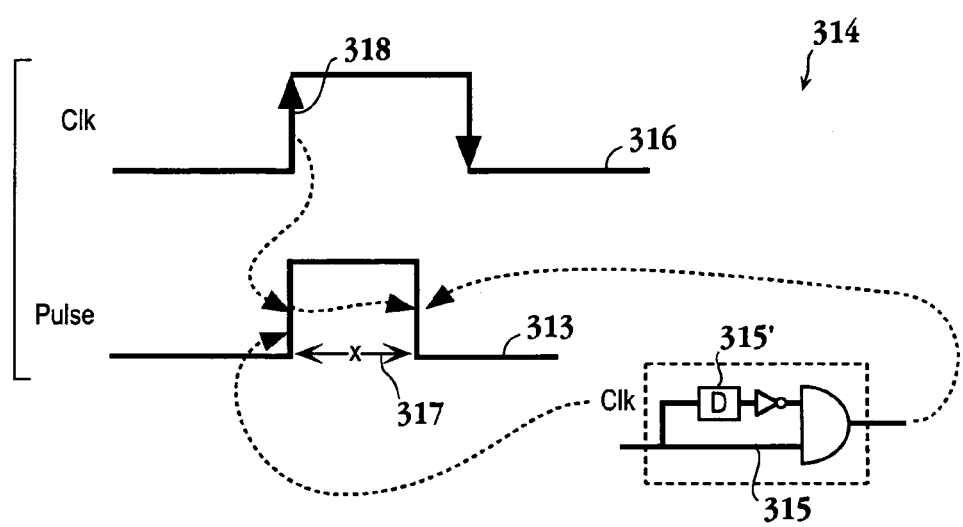
FIG. 6 illustrates a timing diagram which shows a precharge process where a time delay is used to time the precharging process.

FIG. 6 illustrates a timing diagram 314 which shows a precharge process where a time delay is used to time the precharging process. In one embodiment, a clock signal 316 shows that the rising edge 318 initiates the precharge pulse as shown in precharge timing diagram with the precharge pulse associated with time period where the precharge pulse is being charged. In one embodiment, the precharge pulse is charged for a period of X time 317. In such an embodiment, the X time is determined by a time delay of a self-timed pulse such as for example generated by an exemplary circuit 315. In one embodiment, circuit 315 includes a delay circuit 315' which can be any suitable type of circuit configuration that can generate a delay in the signal. In one embodiment the delay circuit 315' includes two inverters. It should be appreciated that the exemplary circuit 315 may be configured in any suitable manner that would generate the delay desired in a particular circumstance depending on the delay desired. As discussed above in reference to FIG. 6, the self-timed pulse and the rising edge of the clock-like signal may be utilized in conjunction make sure that the precharge pulse is a certain width/shape.

Figure 7:
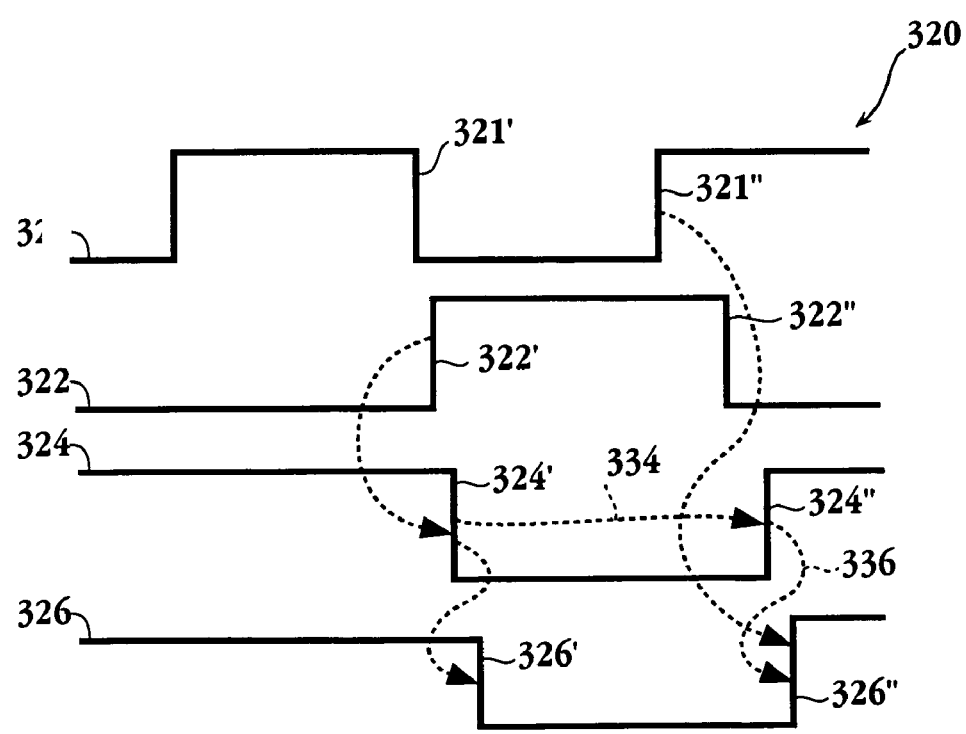
FIG. 7 illustrates a timing diagram which illustrates the use a clock and a delay mechanism to initiate and shape the precharge pulse in accordance with one embodiment of the present invention.

FIG. 7 illustrates a timing diagram 320 which illustrates the use of a clock-like signal and a delay mechanism to initiate and shape the precharge pulse in accordance with one embodiment of the present invention. In one embodiment, signals 321 and 322 are clock-like signals. The signals 321 and 322 may be managed by the precharge management circuit 230a to generate a precharge pulse whose width directly determines the length of time the precharging of bitlines 228a and 228b may occur.

When the signal 322 goes high at a rising edge 322', then a signal 324 goes low at as shown by falling edge 324'. The signal 324 is utilized to start a self-timed pulse. When the signal 324 goes low then a self-timed pulse is generated and then the signal 324 goes high as shown by the rising edge 324" at the end of the self-timed pulse. Thus, the self timed pulse has a duration associated with arrow 334. At the same time the signal 324 goes low, a signal 326 goes low as shown by a falling edge 326'. After the signal 326 goes low, then signal 326 goes high as shown by a rising edge 326" at the later of when the signal 321 goes high or the signal 324 goes high. The signal 326 represents a precharge pulse.

When the signal 326 goes low that is the start of the precharge pulse and when the signal 326 goes high then the precharge pulse ends. As a result, the self-timed pulse guarantees a minimum precharge pulse. This assures that the precharge pulse is charged properly. If the clock width as shown by the signal 321, from falling edge 321' to rising edge 321", is increased to a time period beyond the length of self-timed pulse as shown by the signal 324, the signal 321 increases the precharge pulse width because the precharge time as exemplified by the precharge pulse is increased to the greater of the length of the self-timed pulse and a rising edge 321" of the signal 321. In this way, both the minimum amount of precharging time and a desired maximum precharging time may be managed and controlled.

Figure 8:
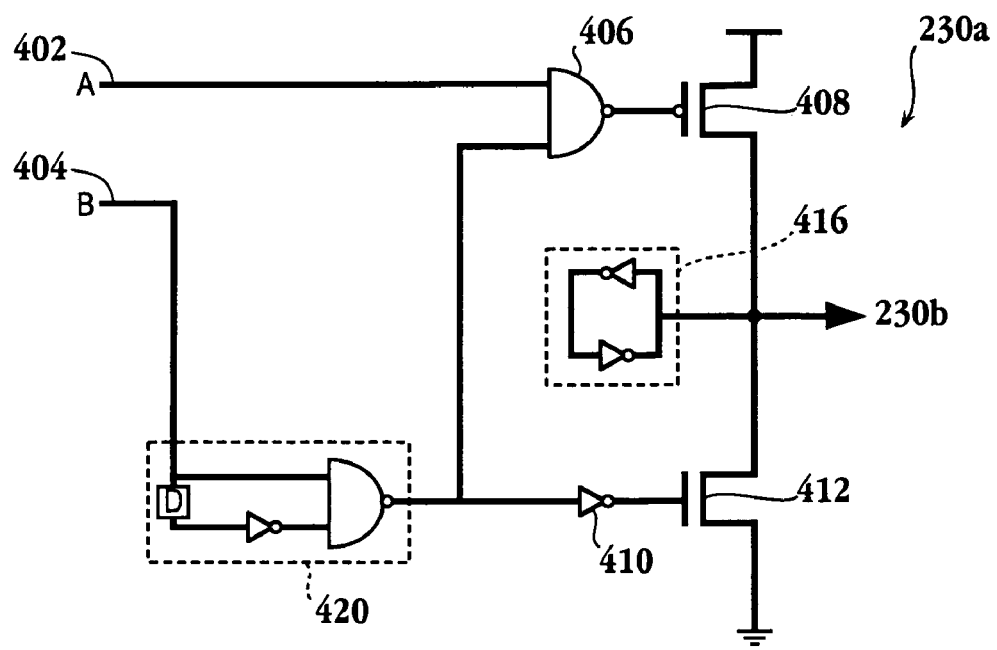
FIG. 8 shows a circuit which generates a precharge pulse in accordance with one embodiment of the present invention.

FIG. 8 shows a circuit 230a which generates a precharge pulse in accordance with one embodiment of the present invention. In one embodiment, the methodology as described in reference to FIG. 7 is accomplished by the circuit 230a. It should be appreciated that the circuit 230a is exemplary in nature and any suitable circuitry configuration may be used which can accomplish the methodology described herein with respect to generating an optimal precharge pulse to make sure that enough time is given to generate a precharge.

In one embodiment, the signal 321 and the signal 322 enters the circuit 230a from a clock A and clock B through inputs 402 and 404 respectively. The signal 321 entering the circuit corresponds to the signal 321 as discussed above in reference to FIG. 7. Therefore, signal 321 represents the clock like signal that can extend the precharge pulse if the cycle of the signal 321 is longer than the length of the self-timed pulse. Signal 322 enters into a delay circuit which generates the signal 324 which corresponds to the self-timed pulse.

The circuit includes a delay circuitry 420 that accepts the signal 322 from a clock B. The circuit further includes a NAND gate 406 that accepts the signal 321 from a clock A and accepts the signal 324 generated by the delay circuit 420. The signal from the NAND gate 406 then controls whether the PMOS 408 is on or off depending on whether the signal from the NAND gate 406 is low or high.

The circuit also includes an inverter 410 which inverts the signal 324 which either turns an NMOS 412 on or off depending whether the signal 324 after being inverted is high or low. The circuit 230a further includes a latch 416. Output 230b from the circuit 230a sends out a precharge pulse. Depending on whether the PMOS 408 is on or off and whether the NMOS 412 is on or off, the latch 416 will stay low which corresponds to a charging state as shown by the time between 326' and 326" (as discussed in reference to FIG. 7) or the latch 416 will be high which corresponds to a non-charging state as shown by the state after the rising edge 326".

The invention may employ various computer-implemented operations involving data stored in computer systems. These operations are those requiring physical manipulation of physical quantities. Usually, though not necessarily, these quantities take the form of electrical signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended Claims. Accordingly, the present embodiments are to be considered as illustrative and not restrictive, and the invention is not to be limited to the details given herein, but may be modified within the scope and equivalents of the appended claims.

What is claimed is:

1. A method of generating a precharge pulse, comprising:
   initiating charging of the precharge pulse at a first edge of a first clock-like signal; and
   ending the charging of the precharge pulse after a time period that is longer of one of a preset delay period and a time period designated by a second edge of a second clock-like signal, wherein ending the charging of the precharge pulse after a time period that is longer of one of a preset delay period and a time period designated by a second edge of the second clock-like signal includes,
   transmitting the first clock-like signal to a first NAND gate;
   contemporaneously transmitting the second clock-like signal to a second NAND gate;
   transmitting an output of the second NAND gate to the first NAND gate and an inverter; and
   maintaining a charging state according to an output from the first NAND gate and the inverter.

2. A method of generating a precharge pulse as recited in claim 1, wherein the first edge is a rising edge and the second edge is a falling edge.

3. A method of generating a precharge pulse as recited in claim 1, wherein the precharge pulse initiates the precharging of bitlines.

4. A method of generating a precharge pulse as recited in claim 1, wherein the precharge pulse shape/width is determined by the latter of the second edge of the second clock-like signal and an end of a self-timed pulse.

5. A method of generating a precharge pulse as recited in claim 1, wherein the precharging ends when the precharge pulse ends.

6. A method of generating a precharge pulse as recited in claim 1, wherein a self-timed pulse is a minimum precharge pulse width.

7. A method of generating a precharge pulse as recited in claim 1, wherein the second edge of the second clock-like signal is the maximum precharge pulse width.

8. A method of generating a precharge pulse as recited in claim 1, wherein the first edge is a falling edge and the second edge is a rising edge.

9. A precharge circuit capable of generating a precharge pulse, comprising:
   circuitry for initiating charging of the precharge pulse at a first edge of a first clock-like signal; and
   circuitry for ending the charging of the precharge pulse after a time period that is longer of one of a preset delay period and a time period designated by a second edge of a second clock-like signal, the circuitry for ending the charging of the precharge pulse including,
     a first NAND gate coupled to a gate of a P-type transistor;
     a second NAND gate coupled to the first NAND gate and an inverter; the inverter coupled to a gate of an N-type transistor; and
     a storage element in electrical communication with the P-type transistor and the N-type transistor.

10. A precharge circuit as recited in claim 9, wherein the first edge is a rising edge and the second edge is a falling edge.

11. A precharge circuit as recited in claim 9, wherein the precharge pulse initiates the precharging of bitlines.

12. A precharge circuit as recited in claim 11, wherein the preset delay period is determined by a self-timed pulse.

13. A precharge circuit as recited in claim 12, wherein the precharge pulse shape/width is determined by the latter of the second edge of the second clock-like signal and an end of the self-timed pulse.

14. A precharge circuit as recited in claim 12, wherein the self timed pulse is a minimum precharge pulse width.

15. A precharge circuit as recited in claim 9, wherein the precharging ends when the precharge pulse ends.

16. A precharge circuit as recited in claim 9, wherein the second edge of the second clock-like signal is the maximum precharge pulse width.

17. A precharge circuit as recited in claim 9, further comprising:
   circuitry for receiving the precharge pulse and generating a precharge for a time corresponding to the duration of the precharge pulse.

18. A method of generating a precharge pulse, comprising:
   initiating charging of the precharge pulse at a first edge of a first clock-like signal; and
   ending the charging of the precharge pulse after a time period that is longer of one of a preset delay period and a time period designated by a second edge of a second clock-like signal, the preset delay period being determined by a self-timed pulse; ending the charging further including,
     transmitting the first clock like signal to a first NAND gate;
     contemporaneously transmitting the second clock like signal to a second NAND gate;
     transmitting an output of the second NAND gate to the first NAND gate and an inverter; and
     maintaining a charging state according to an output from the first NAND gate and the inverter,
   wherein the precharge pulse initiates the precharging of bitlines and the precharging terminates when the precharge pulse ends.

19. A method of generating a precharge pulse as recited in claim 18, wherein the first edge is a rising edge and the second edge is a falling edge.

20. A method of generating a precharge pulse as recited in claim 19, wherein the precharge pulse width is determined by the latter of the second edge of the second clock-like signal and an end of the self-timed pulse.

21. A method of generating a precharge pulse as recited in claim 18, wherein the self timed pulse is a minimum precharge pulse width.

22. A method of generating a precharge pulse as recited in claim 18, wherein the second edge of the second clock-like signal is a maximum precharge pulse width.

23. A method of generating a precharge pulse as recited in claim 18, wherein the first edge is a falling edge and the second edge is a rising edge.

* * * * *